US009460757B2

(12) United States Patent
Rothenberg et al.

(10) Patent No.: US 9,460,757 B2
(45) Date of Patent: Oct. 4, 2016

(54) FLEXIBLE CABLE ASSEMBLY HAVING REDUCED-TOLERANCE ELECTRICAL CONNECTION PADS

(71) Applicant: HGST Netherlands B.V., Amsterdam (NL)

(72) Inventors: Edgar Dennis Rothenberg, San Jose, CA (US); Yiduo Zhang, Cupertino, CA (US)

(73) Assignee: HGST Netherlands B.V., Amsterdam (NL)

( * ) Notice: Subject to any disclaimer, the term of this patent is extended or adjusted under 35 U.S.C. 154(b) by 234 days.

(21) Appl. No.: 14/071,430

(22) Filed: Nov. 4, 2013

(65) Prior Publication Data

US 2015/0124352 A1    May 7, 2015

(51) Int. Cl.
*G11B 33/12* (2006.01)
*H05K 1/11* (2006.01)
*H01R 12/59* (2011.01)
*H05K 1/02* (2006.01)
*G11B 5/48* (2006.01)

(52) U.S. Cl.
CPC ........... *G11B 33/122* (2013.01); *G11B 5/4846* (2013.01); *H05K 1/118* (2013.01); *H01R 12/592* (2013.01); *H05K 2201/099* (2013.01); *H05K 2201/09445* (2013.01)

(58) Field of Classification Search
CPC .... H05K 1/118; H05K 1/028; G11B 5/4846; H01R 12/778; H01R 12/71
USPC ...................................... 360/264.5
See application file for complete search history.

(56) References Cited

U.S. PATENT DOCUMENTS

| | | | |
|---|---|---|---|
| 4,526,436 A | 7/1985 | Aso | |
| 4,695,108 A | 9/1987 | Ichitsubo | |
| 4,871,317 A * | 10/1989 | Jones | H05K 1/0286 174/534 |
| 4,900,268 A | 2/1990 | Kunishi | |
| 5,495,377 A * | 2/1996 | Kim | G11B 5/486 360/264.2 |
| 5,498,840 A * | 3/1996 | Maggio et al. | 174/260 |
| 5,609,496 A | 3/1997 | Kilmer et al. | |
| 5,838,519 A * | 11/1998 | Takizawa et al. | 360/245.9 |
| 5,909,338 A | 6/1999 | Butler et al. | |
| 6,396,665 B1 * | 5/2002 | Asano | G11B 5/486 360/264.2 |
| 6,699,395 B1 * | 3/2004 | Svenkeson et al. | 216/13 |
| 6,812,410 B2 | 11/2004 | Sakamoto et al. | |
| 6,856,490 B2 | 2/2005 | Rosner et al. | |
| 6,934,126 B1 | 8/2005 | Berding et al. | |
| 7,372,669 B2 * | 5/2008 | Deguchi et al. | 360/245.9 |
| 7,446,261 B2 * | 11/2008 | Kumar et al. | 174/254 |
| 7,690,923 B2 | 4/2010 | Horchler et al. | |
| 8,213,124 B2 | 7/2012 | Chang et al. | |
| 2003/0070834 A1 * | 4/2003 | Tsuchiya et al. | G11B 5/486 174/250 |
| 2005/0199680 A1 * | 9/2005 | Matsumoto et al. | G11B 5/4853 228/101 |

(Continued)

Primary Examiner — Craig A. Renner
(74) Attorney, Agent, or Firm — John D. Henkhaus

(57) ABSTRACT

A flexible printed circuit (FPC) may have reduced-tolerance electrical connection pads that comprise a connection portion and an adjacent window portion, where the position of a component that is mechanically and electrically connected to the FPC is limited by the geometry of the connection portion of the respective connection pads. The window portion includes an area void of conductive material and bounded by the connection portion on one side and may be bounded by peripheral portions on the other sides, where the peripheral portions are significantly narrower than the connection portion. A portion of the peripheral portions extending from the connection portion may be tucked under a portion of the FPC cover layer to prevent peeling of the peripheral portions.

16 Claims, 5 Drawing Sheets

(56) References Cited

U.S. PATENT DOCUMENTS

| | | | |
|---|---|---|---|
| 2006/0034018 A1* | 2/2006 | Deguchi et al. | 360/245.9 |
| 2006/0139809 A1* | 6/2006 | Matsumoto et al. | G11B 5/4853 360/234.5 |
| 2007/0075056 A1* | 4/2007 | Ho et al. | G11B 5/4846 219/121.66 |
| 2007/0102830 A1* | 5/2007 | Muto et al. | 257/784 |
| 2008/0156437 A1* | 7/2008 | Kawate et al. | 156/330 |
| 2009/0207529 A1* | 8/2009 | Yao | 360/245.9 |
| 2011/0090599 A1* | 4/2011 | Feng et al. | G11B 5/486 360/245.3 |
| 2013/0344717 A1* | 12/2013 | Ito | 439/78 |

* cited by examiner

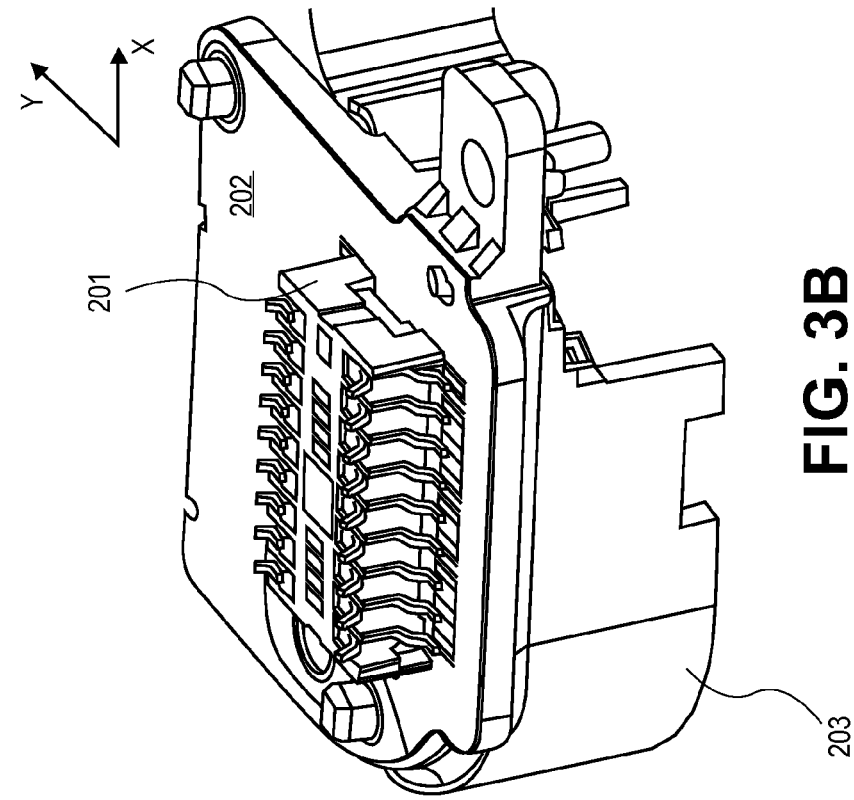
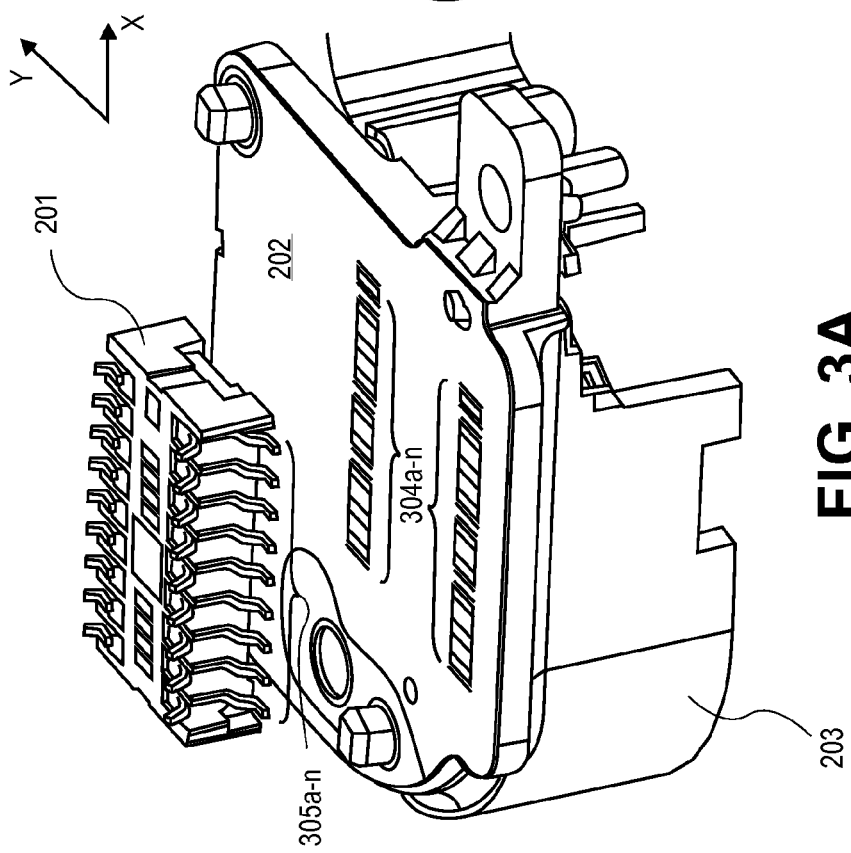
FIG. 3A
FIG. 3B

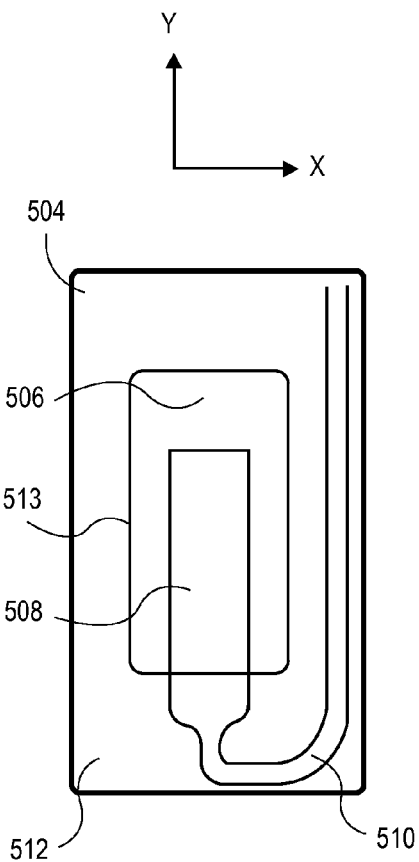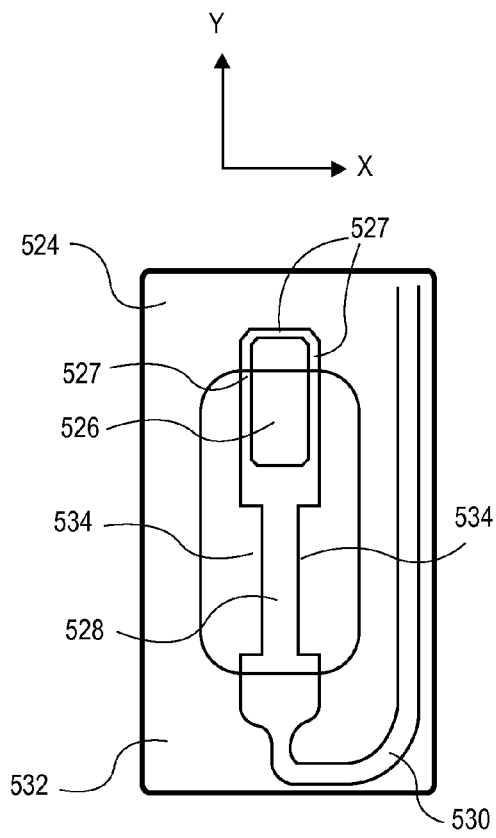
FIG. 5A  FIG. 5B

FLEXIBLE CABLE ASSEMBLY HAVING REDUCED-TOLERANCE ELECTRICAL CONNECTION PADS

FIELD OF EMBODIMENTS OF THE INVENTION

Embodiments of the invention relate generally to flexible cable assemblies and more particularly to a reduced-tolerance electrical connection pad feature for a flexible cable assembly.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read/write head that is positioned over a specific location of a disk by an actuator.

A read/write head uses a magnetic field to read data from and write data to the surface of a magnetic-recording disk. Write heads make use of the electricity flowing through a coil, which produces a magnetic field. Electrical pulses are sent to the write head, with different patterns of positive and negative currents. The current in the coil of the write head induces a magnetic field across the gap between the head and the magnetic disk, which in turn magnetizes a small area on the recording medium.

Hard disk drives are highly complex technological devices having many interacting components and sub-components. Increasing areal density (a measure of the quantity of information bits that can be stored on a given area of disk surface) is one of the ever-present holy grails of hard disk drive design evolution. However, the market demands increased areal density while maintaining the overall HDD form factor and, generally, without increasing cost. Thus, in view of such competing demands, maintaining and/or reducing physical tolerances within an HDD is an important design goal and an ongoing challenge.

SUMMARY OF EMBODIMENTS

Embodiments are directed towards a flexible printed circuit (FPC) having reduced-tolerance electrical connection pads, to a flexible cable assembly having such an FPC, and to a hard disk drive comprising such an FPC. The reduced-tolerance electrical connection pads constituent to the FPC comprise a connection portion and a window portion, where the position of the component that is electrically connected to the FPC is limited by the geometry of the connection portion of the respective electrical connection pads, thereby reducing the dimensional tolerance associated with the attached component.

According to an embodiment, the window and connection portions of the electrical connection pads are adjacent each other in the particular direction in which the tolerance reduction is desired. According to an embodiment, the electrical connection pads are formed of copper and the window portion of the respective electrical connection pads includes an area void of copper and bounded by the connection portion on one side and peripheral portions on the other sides, e.g., like a window, where the peripheral portions are significantly narrower than the connection portion. According to an embodiment, a portion of the peripheral portions extending from the connection portion are tucked under a portion of the FPC cover layer, near a cover layer cutout, to prevent peeling of the peripheral portions due to shear or other forces.

Embodiments discussed in the Summary of Embodiments section are not meant to suggest, describe, or teach all the embodiments discussed herein. Thus, embodiments of the invention may contain additional or different features than those discussed in this section.

BRIEF DESCRIPTION OF THE DRAWINGS

Embodiments of the invention are illustrated by way of example, and not by way of limitation, in the figures of the accompanying drawings and in which like reference numerals refer to similar elements and in which:

FIG. 3A is an exploded perspective view illustrating a flexible cable assembly (FCA), according to an embodiment of the invention;

FIG. 3B is a perspective view illustrating an FCA, according to an embodiment of the invention;

FIG. 5A is a diagram illustrating an electrical connection pad of a FPC, according to an embodiment of the invention; and FIG. 5B is a diagram illustrating an electrical connection pad of a FPC, according to an embodiment of the invention.

DETAILED DESCRIPTION

Approaches to a flexible printed circuit (FPC) having reduced-tolerance electrical connection pads, for use in a hard disk drive for example, are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

PHYSICAL DESCRIPTION OF ILLUSTRATIVE EMBODIMENTS

Figure 1:
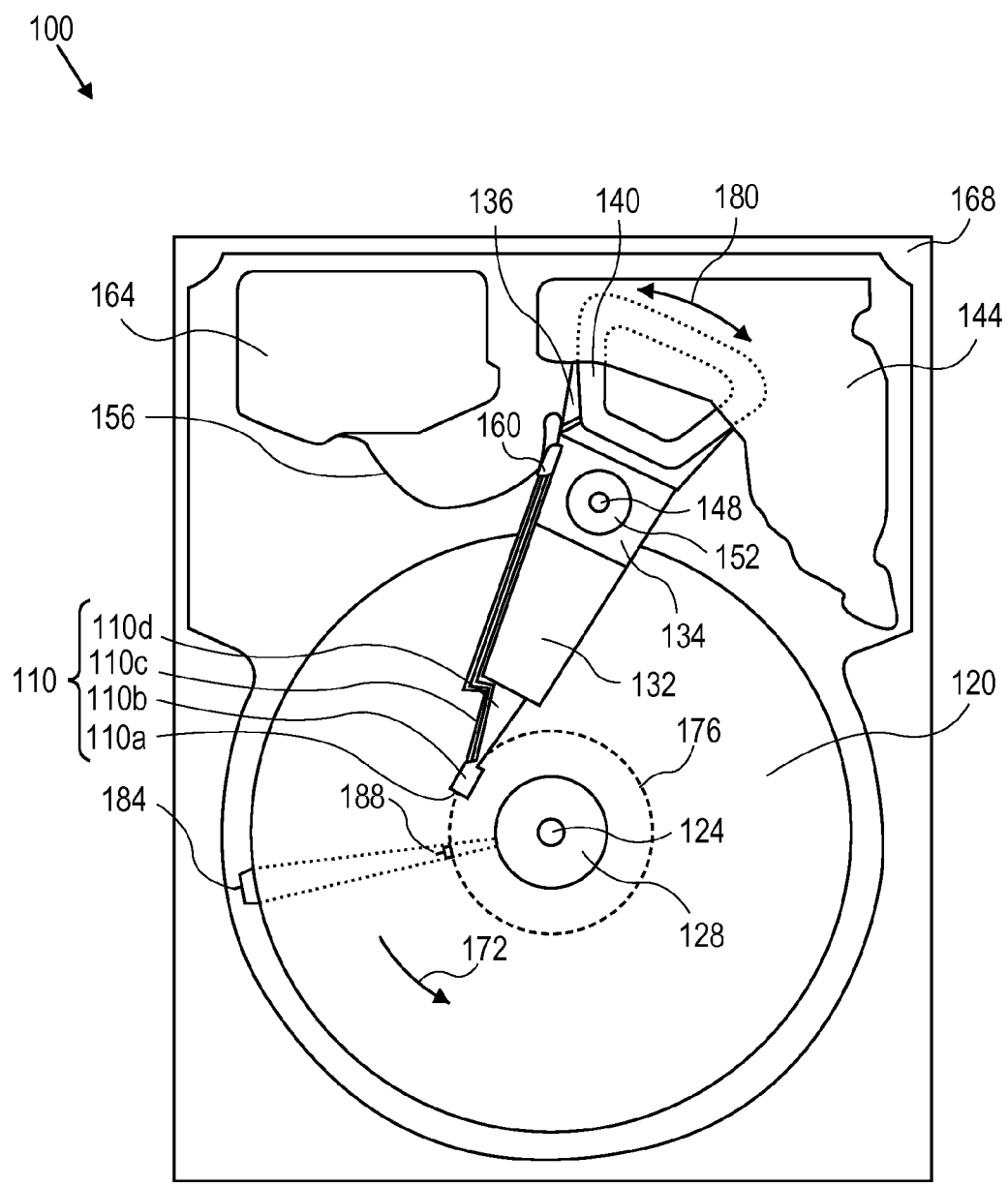
FIG. 1 is a plan view illustrating a hard disk drive (HDD), according to an embodiment of the invention.

Embodiments of the invention may be used in the context of a flexible cable assembly (FCA) for a hard-disk drive (HDD). In accordance with an embodiment, a plan view illustrating an HDD 100 is shown in FIG. 1. FIG. 1 illustrates the functional arrangement of components of the HDD including a slider 110b that includes a magnetic-reading/recording head 110a. Collectively, slider 110b and head 110a may be referred to as a head slider. The HDD 100 includes at least one head gimbal assembly (HGA) 110 including the head slider, a lead suspension 110c attached to the head slider, and a load beam 110d attached to the lead suspension 110c. The HDD 100 also includes at least one magnetic-recording media 120 rotatably mounted on a spindle 124 and a drive motor attached to the spindle 124 for rotating the media 120. The head 110a includes a write element and a read element for respectively writing and reading information stored on the media 120 of the HDD 100. The media 120 or a plurality of disks may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134; and a stator 144 including a voice-coil magnet. The armature 136 of the VCM is attached to the carriage 134 and is configured to move the arm 132 and the HGA 110 to access portions of the media 120 being mounted on a pivot-shaft 148 with an interposed pivot-bearing assembly 152. In the case of an HDD having multiple disks, or platters as disks are sometimes referred to in the art, the carriage 134 is called an "E-block," or comb, because the carriage is arranged to carry a ganged array of arms that gives it the appearance of a comb.

With further reference to FIG. 1, in accordance with an embodiment of the present invention, electrical signals, for example, current to the voice coil 140 of the VCM, write signal to and read signal from the head 110a, are provided by a flexible interconnect cable 156 ("flex cable"). Interconnection between the flex cable 156 and the head 110a may be provided by an arm-electronics (AE) module 160, which may have an on-board pre-amplifier for the read signal, as well as other read-channel and write-channel electronic components. The AE 160 may be attached to the carriage 134 as shown. The flex cable 156 is coupled to an electrical-connector block 164, which provides electrical communication through electrical feedthroughs provided by an HDD housing 168. The HDD housing 168, also referred to as a casting, depending upon whether the HDD housing is cast, in conjunction with an HDD cover provides a sealed, protective enclosure for the information storage components of the HDD 100.

With further reference to FIG. 1, in accordance with an embodiment of the present invention, other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the media 120 that is affixed to the spindle 124 by the disk clamp 128; as a result, the media 120 spins in a direction 172. The spinning media 120 creates a cushion of air that acts as an air-bearing on which the air-bearing surface (ABS) of the slider 110b rides so that the slider 110b flies above the surface of the media 120 without making contact with a thin magnetic-recording medium in which information is recorded.

The electrical signal provided to the voice coil 140 of the VCM enables the head 110a of the HGA 110 to access a track 176 on which information is recorded. Thus, the armature 136 of the VCM swings through an arc 180 which enables the HGA 110 attached to the armature 136 by the arm 132 to access various tracks on the media 120. Information is stored on the media 120 in a plurality of stacked tracks arranged in sectors on the media 120, for example, sector 184. Correspondingly, each track is composed of a plurality of sectored track portions, for example, sectored track portion 188. Each sectored track portion 188 is composed of recorded data and a header containing a servo-burst-signal pattern, for example, an ABCD-servo-burst-signal pattern, information that identifies the track 176, and error correction code information. In accessing the track 176, the read element of the head 110a of the HGA 110 reads the servo-burst-signal pattern which provides a position-error-signal (PES) to the servo electronics, which controls the electrical signal provided to the voice coil 140 of the VCM, enabling the head 110a to follow the track 176. Upon finding the track 176 and identifying a particular sectored track portion 188, the head 110a either reads data from the track 176 or writes data to the track 176 depending on instructions received by the disk controller from an external agent, for example, a microprocessor of a computer system.

Introduction

As mentioned, dimensional tolerances are an important design criteria and constraint in the context of hard disk drive development, as well as with practically all other hardware devices and systems. Thus, reducing dimensional tolerances is an ongoing design challenge. Consider the following example in the context of a hard disk drive.

Figure 2:
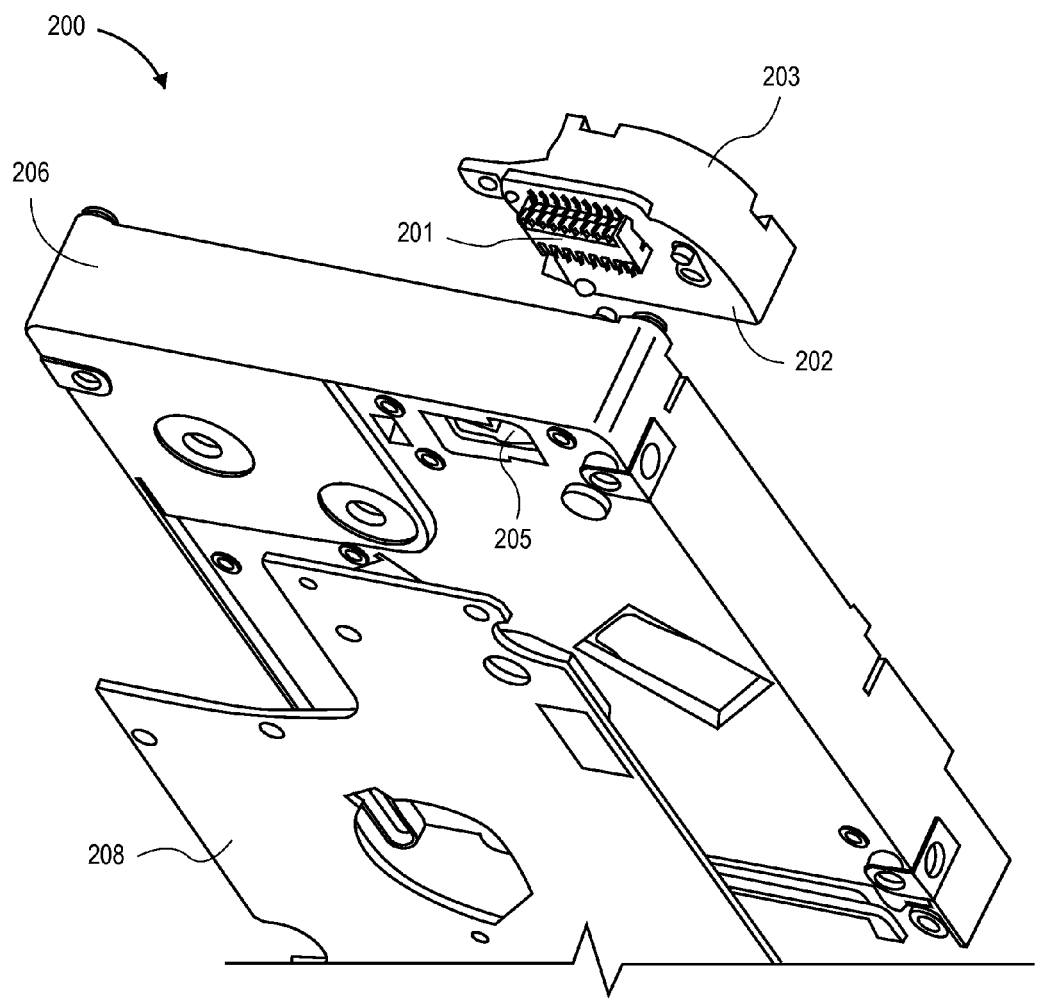
FIG. 2 is an exploded perspective view illustrating components of an HDD, according to an embodiment of the invention.

FIG. 2 is an exploded perspective view illustrating components of a hard disk drive (HDD), according to an embodiment of the invention. FIG. 2 depicts HDD 200, which comprises a flexible printed circuit (FPC) 202 (see, e.g., flex cable 156 of FIG. 1) attached to an electrical connector block 203 (see, e.g., electrical-connector block 164 of FIG. 1). Further, there is a connector 201 that is mechanically and electrically connected to the FPC 202. As an assembly, HDD 200 further comprises a base 206 having an opening 205 through which the connector 201 is fit, in order to connect the FPC 202 to a printed circuit board (PCB) 208.

FIG. 3A is an exploded perspective view illustrating a flexible cable assembly (FCA), and FIG. 3B is a perspective view illustrating the FCA of FIG. 3A, both of which are according to an embodiment of the invention. FIG. 3A depicts the FPC 202 coupled to the electrical connector block 203, with the connector 201 in exploded position prior to mechanical and electrical connection with FPC 202. Connector 201 is connected to FPC 202 by way of electrical connection pads 304a-304n, where n equals the total number of connection pads/connector pins, which may vary from implementation to implementation. FIG. 3B depicts the FPC 202 coupled to the electrical connector block 203, with the connector 201 mechanically and electrically connected to FPC 202 by way of electrical connection pads 304a-304n.

The placement and the positional tolerance of the connector 201 with respect to its attachment to the FPC 202 has a significant impact on, for example, the process of fitting the connector 201 through the opening 205 in base 206 as well as the ability to provide a sound electrical contact and connection between the pins of the connector 201 and the electrical connection pads on the PCB 208. Additionally, as more functionality is added to HDDs (e.g., dual-stage actuation, embedded contact sensing, energy-assisted magnetic recording, etc.), more and more pins are needed on a connector such as connector 201. Note that the assembly of connector 201 to FPC 202 has better tolerance in the X direction than in the Y direction. That is, when using a solder reflow process to attach connector 201 to FPC 202, the connector pins 305a-n of connector 201 may slip or "skate" on the layer of solder paste applied to the FPC 202 for the solder reflow process, thus manifesting as dimensional tolerance of the FPC 202 to base 206 assembly. Therefore, reducing Y direction tolerance is a challenge for the FPC 202 to base 206 assembly and the corresponding assembly procedure. However, machining the base with tighter tolerance for opening 205, or reducing the size tolerance of the connector 201 body would add cost and may even be outside the manufacturing process capabilities.

Flexible Cable Assembly with Reduced-Tolerance Connection Pad

Figure 4:
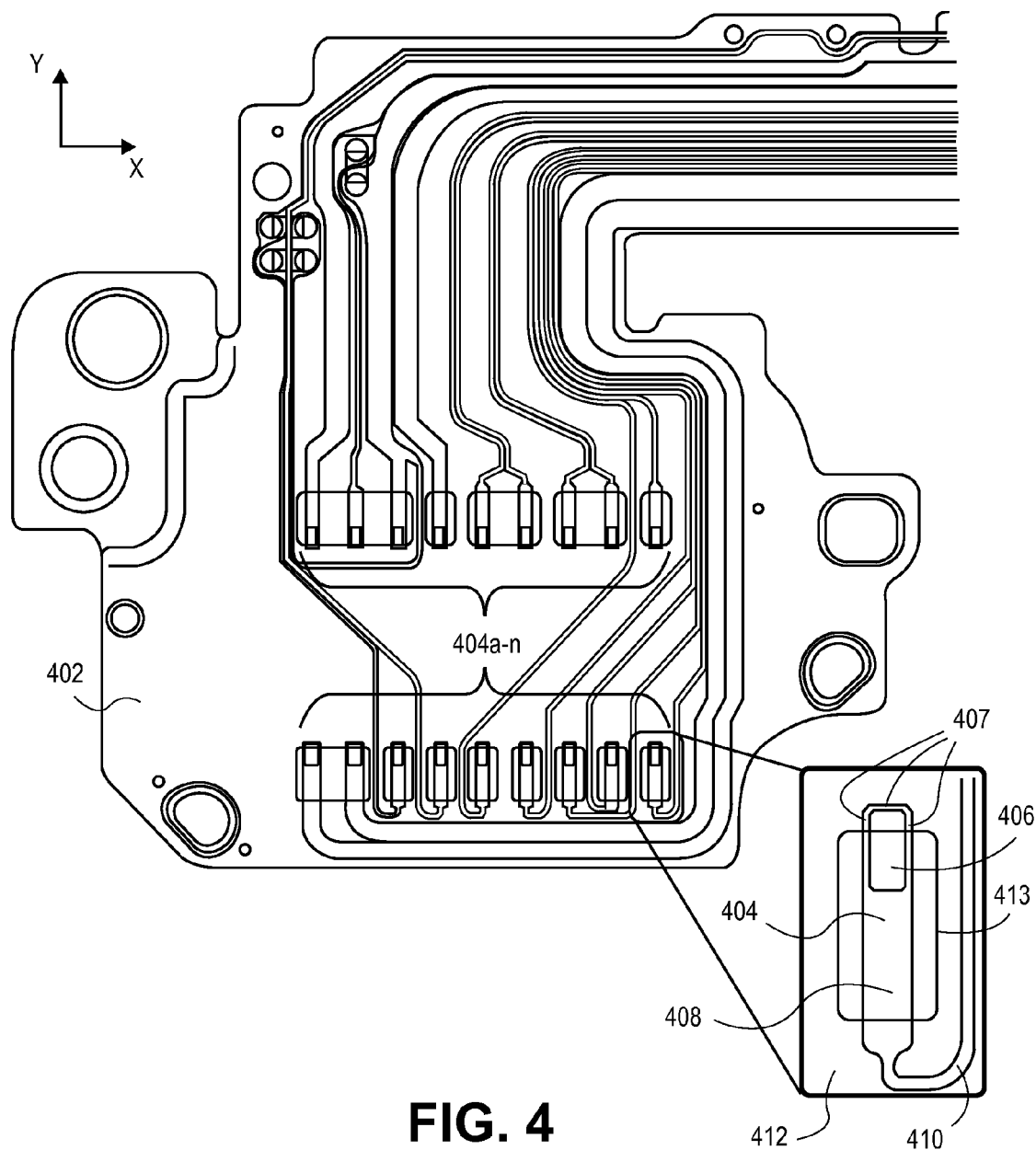
FIG. 4 is a diagram illustrating a flexible printed circuit (FPC), according to an embodiment of the invention.

FIG. 4 is a diagram illustrating a flexible printed circuit (FPC), according to an embodiment of the invention. With reference to FIG. 4, an FPC 402 is described, which may be implemented with a hard disk drive, such as an FPC conveying data between a head stack assembly and a connector to a host system. However, embodiments may be applicable generally to any FPC or flexible cable assembly on which a component is soldered.

According to an embodiment, FPC 402 includes multiple electrical connection pads, 404a-n, where n equals the total number of connection pads/connector pins, which may vary from implementation to implementation. The magnified view window of FIG. 4 presents a magnified view of a connection pad 404, which comprises a window portion 406 and a connection portion 408. As depicted, the window portion 406 and connection portion 408 are adjacent each other along a particular direction, e.g., what is depicted as the "Y" direction. According to an embodiment, the conductive portions of the connection pads 404a-n are formed of copper.

As discussed, during the solder reflow process typically utilized for connecting a component such as connector 201 (FIGS. 2, 3A, 3B) to the raw FPC 402, a coating of solder paste is applied to the raw FPC 402. Thus, the connector pins 305a-n of connector 201 may slip or "skate" on the layer of solder paste applied to the FPC 402 before completely adhering to the FPC 402, a phenomenon inherent to the solder reflow process. However, the slipping phenomenon, and any constraints applied thereto, is based on surface tension between the solder paste and the conductive material of the connection pads 404. Therefore, by forming window portion 406 the connection portion 408 is constrained, thereby reducing the area of the FPC 402 that is covered with conductive material. By constraining the geometry of the FPC 402 that is covered with conductive material, one can limit the area over which the solder paste can reflow, thereby limiting the area over which the connector pins 305a-n can skate on the FPC 402. This effectively constrains the boundaries of the degrees of freedom over which the connector pins 305a-n can skate which, stated otherwise, reduces the positional tolerance of the connector 201-to-FPC 402 assembly.

As depicted in FIG. 4 and according to an embodiment, window portion 406 is configured with an area void of conductive material (e.g., copper) bounded by the connection portion 408 on one side and by peripheral portions 407 on the other sides. The peripheral portions 407 are substantially and significantly narrower or thinner than the connection portion 408. In the configuration depicted, the connection pad 404 and the window portion 406 are generally rectangular in shape. Thus, according to an embodiment, window portion 406 is configured with three peripheral portions 407, one bounding each side of the void except for the side at which the connection portion 408 is adjacent. However, the shape of connection pad 404 and window portion 406 may vary from implementation to implementation. For a non-limiting example, window portion could be formed into a triangular shape having two peripheral portions 407 bounding the void in addition to the connection portion 408. Further, each of the connection pads 404a-n could be configured as shown and described in reference to FIG. 4, or the configuration of connection pads could vary from location to location within the FPC 402.

Flexible cable assemblies are typically formed of layers. Thus, FPC 402 is formed of multiple layers, including a copper layer 410 and a cover layer 412. According to an embodiment, the connection pad 402 is formed by etching copper. Therefore, the connection portion 408 and the portion of the window portion 406 that contains conductive material, such as peripheral portions 407, reside on the copper layer 410, which may reside for example on a base layer or an adhesive layer. The cover layer 412 is configured to cover a portion of the copper layer 410, and comprises one or more cutouts over portions of the copper layer 410. For example, cover layer 412 comprises a cutout 413 over a portion of each of the connection pads 404a-n, in order to provide the ability to solder a component to the FPC 402 via the connection pads 404a-n. According to an embodiment, and as depicted in FIG. 4, a portion of the peripheral portions 407 that extend from the connection portion 408 are tucked under a portion of the cover layer adjacent to cutout 413. This technique can help prevent potential peeling of the peripheral portions 407 from its underlying layer, such as a base layer, due to shear or other forces. However, the size and shape of window portion 406 may vary from implementation to implementation and, therefore, could be formed without any peripheral portions 407, as in the embodiment depicted in FIG. 5A.

FIG. 5A is a diagram illustrating an electrical connection pad of an FPC, according to an embodiment. As mentioned, FIG. 5A depicts a configuration of a connection pad 504, in which there are no peripheral portions 407. Thus, window portion 506 is configured on a copper layer 510, with an area void of conductive material (e.g., copper) bounded only by the connection portion 508 on one side. Similarly as with connection pad 404 (FIG. 4), connection pad 504 comprises a cover layer 512 configured to cover a portion of the copper layer 510, where the cover layer 512 comprises a cutout 513 over respective portions of the copper layer 510, such as over portions of each electrical pad 504.

FIG. 5B is a diagram illustrating an electrical connection pad of a FPC, according to an embodiment. Similarly as with connection pad 404 (FIG. 4), window portion 526 of connection pad 524 is configured with an area void of conductive material (e.g., copper) bounded by the connection portion 528 on one side and by peripheral portions 527 on the other sides. The peripheral portions 527 are substantially and significantly narrower or thinner than the connection portion 528. In the configuration depicted in FIG. 5B, window portion 526 is configured with three peripheral portions 527, one bounding each side of the void except for the side at which the connection portion 528 is adjacent. However, the shape of connection pad 524 and window portion 526 may vary from implementation to implementation. For a non-limiting example, window portion could be formed into a triangular shape having two peripheral portions 527 bounding the void in addition to the connection portion 528.

Thus, window portion 526 is configured on a copper layer 530, with an area void of conductive material (e.g., copper) bounded by the connection portion 528 on one side and by peripheral portions 527 on the other sides. Similarly as with connection pad 404 (FIG. 4), connection pad 524 comprises a cover layer 532 configured to cover a portion of the copper layer 530, where the cover layer 532 comprises a cutout over respective portions of the copper layer 530, such as over portions of each electrical pad 524.

Connection portion 528 of connection pad 524 further comprises one or more cutouts 534 from the connection portion 528, along the "X" direction normal to the "Y"

direction. As discussed, the connector pins 305a-n (FIGS. 3A, 3B) of connector 201 may slip or "skate" on the layer of solder paste applied to the FPC 402 (FIG. 4) before completely adhering to the FPC 402, a phenomenon inherent to the solder reflow process. Therefore, similarly in concept as with connection pads 404a-n (FIG. 4), by forming cutouts 534 in the "X" direction the connection portion 528 is constrained, thereby reducing the area of the FPC 402 that is covered with conductive material. By constraining the geometry that is covered with conductive material, one can limit the area over which the solder paste can reflow, thereby limiting the area over which the connector pins 305a-n can skate in the "X" direction. This further constrains the boundaries of the degrees of freedom over which the connector pins 305a-n can skate which, stated otherwise, reduces the positional tolerance of the connector 201-to-FPC 402 assembly in the "X" direction.

The foregoing embodiments provide for reduced-tolerance electrical connection pads for a flexible printed circuit, generally, without adding additional cost or fabrication process complication and without affecting the electrical performance of the flexible cable assembly. For a non-limiting example, experimentation has shown a tolerance reduction in the "Y" direction on the order of 50% reduction.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A flexible printed circuit (FPC) comprising:
    a plurality of electrical connection pads for electrically connecting and bonding a component to said FPC, said electrical connection pads comprising a window portion and a connection portion;
    wherein said electrical connection pads are formed of copper constituent to a copper layer, and wherein said window portion comprises an area void of copper bounded by said connection portion on one side and by peripheral portions on each other side, and wherein said peripheral portions are substantially narrower than said connection portion;
    a cover layer positioned to cover at least a portion of said copper layer, said cover layer comprising a respective cutout over a portion of each said electrical connection pad; and
    wherein a portion of said peripheral portions extending from said connection portion are tucked under a portion of said cover layer adjacent said cutout.

2. The flexible printed circuit of claim 1, wherein the position of said component when electrically connected to said FPC is limited by the geometry of said connection portion.

3. The flexible printed circuit of claim 1, wherein said window portion and said connection portion are adjacent along a particular direction.

4. The flexible printed circuit of claim 3, further comprising:
    one or more cutouts from said connection portion along lateral sides of said connection portion.

5. The flexible printed circuit of claim 1, wherein said window portion is formed with etched copper.

6. The flexible printed circuit of claim 1, wherein said electrical connection pads are substantially rectangular.

7. A hard disk drive, comprising:
    a head slider comprising a magnetic read/write head for reading data from and writing data to one or more magnetic-recording disks;
    a magnetic-recording disk rotatably mounted on a spindle;
    a voice coil actuator configured to move the head slider to access portions of the magnetic-recording disk;
    a base housing;
    a flexible printed circuit (FPC) configured to carry signals between said head slider and a printed circuit board (PCB) through an opening in said base housing, said FPC comprising:
        a plurality of electrical connection pads for electrically connecting a connector to said FPC, said electrical connection pads comprising a window portion and a connection portion; and
    said connector soldered to said FPC and fitted through said opening in said base housing to electrically connect with said PCB.

8. The hard disk drive of claim 7, wherein the position of said connector when electrically connected to said FPC is limited by the geometry of said connection portion.

9. The hard disk drive of claim 7, wherein said window portion and said connection portion are adjacent along a particular direction.

10. The hard disk drive of claim 9, said FPC further comprising:
    one or more cutouts from said connection portion along lateral sides of said connection portion.

11. The hard disk drive of claim 7, wherein said electrical connection pads are formed of copper and are substantially rectangular, and wherein said window portion comprises an area void of copper bounded by said connection portion on one side and by peripheral portions on each of three other sides, and wherein said peripheral portions are substantially narrower than said connection portion.

12. The hard disk drive of claim 11, wherein said window portion and said connection portion are constituent to a copper layer, said FPC further comprising:
    a cover layer positioned to cover at least a portion of said copper layer, said cover layer comprising a respective cutout over a portion of each said electrical connection pad; and
    wherein a peripheral portion opposing said connection portion and a portion of said peripheral portions extending from said connection portion are tucked under a portion of said cover layer adjacent said cutout.

13. The hard disk drive of claim 7, wherein said electrical connection pads are formed of copper and are substantially rectangular, and wherein said window portion comprises an area void of copper.

14. A flexible cable assembly (FCA) comprising:
    a plurality of copper electrical connection pads for electrically connecting connector pins to a flexible printed circuit (FPC), said electrical connection pads comprising a window portion and a connection portion adjacent along a particular direction;
    wherein said connector pins are bonded to said FPC with solder, wherein the position of said connector pins in said particular direction is limited by the geometry of said connection portion of said electrical connection pads;

wherein said electrical connection pads are formed of copper constituent to a copper layer, and wherein said window portion comprises an area void of copper bounded by said connection portion on one side and by peripheral portions on each other side, and wherein said peripheral portions are substantially narrower than said connection portion;

a cover layer positioned to cover at least a portion of said copper layer, said cover layer comprising a respective cutout over a portion of each said electrical connection pad; and wherein a portion of said peripheral portions extending from said connection portion are tucked under a portion of said cover layer adjacent said cutout.

15. The flexible cable assembly of claim 14, wherein said electrical connection pads are substantially rectangular, wherein a peripheral portion opposing said connection portion is tucked under a portion of said cover layer adjacent said cutout.

16. A method of bonding an electrical connector having connector pins to a flexible printed circuit (FPC) having electrical connection pads, the method comprising:

applying solder paste to at least a portion of the FPC;

positioning said connector pins in contact with said electrical connection pads, wherein said electrical connection pads comprise a window portion and a connection portion, and wherein said window portion comprises an area void of copper bounded by said connection portion on one side and by peripheral portions along each of three other sides;

wherein said window portion and said connection portion are constituent to a copper layer covered at least in part with a cover layer comprising a respective cutout over a portion of each said electrical connection pad;

wherein a peripheral portion opposing said connection portion and a portion of said peripheral portions extending from said connection portion are tucked under a portion of said cover layer adjacent said respective cutout; and reflowing said solder to bond said connector pins directly to said electrical connection pads, wherein a permanent position of said connector pins is limited to within said connection portion.

* * * * *